United States Patent
Ishikiriyama et al.

(10) Patent No.: US 6,452,245 B1
(45) Date of Patent: Sep. 17, 2002

(54) SEMICONDUCTOR DEVICE

(75) Inventors: Mamoru Ishikiriyama; Katsuhito Sasaki, both of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 7 days.

(21) Appl. No.: 09/635,576

(22) Filed: Aug. 9, 2000

(30) Foreign Application Priority Data

Sep. 20, 1999 (JP) ............................................ 11-265157

(51) Int. Cl.$^7$ ......................... H01L 23/58; H01L 29/88
(52) U.S. Cl. ...................... 257/488; 257/104; 257/489
(58) Field of Search ................................ 257/104, 105, 257/106, 199, 488, 489, 490, 551, 603, 605, 606, 345, 349, 354, 399, 400, 401, 409, 484, 618, 619, 653, 654; 438/140, 454

(56) References Cited

U.S. PATENT DOCUMENTS 5,434,445 A * 7/1995 Ravanelli et al. ........... 257/488

FOREIGN PATENT DOCUMENTS

| JP | 59-154056 | * | 9/1984 |
| JP | 11-204632 | | 7/1999 |

* cited by examiner

*Primary Examiner*—Steven Loke
*Assistant Examiner*—Hung Kim Vu
(74) *Attorney, Agent, or Firm*—Volentine Francos, PLLC

(57) ABSTRACT

The present invention provides a semiconductor device capable of improving a withstand voltage for a wire placed in the neighborhood of a contact. When the direction in which a wiring layer extends in the direction of a plane as viewed from the top of a substrate, is defined as a first direction, the direction orthogonal to the first direction on the plane is defined as a second direction, a radius of curvature of a conductive material layer closest to the opening is defined as R, a point where the conductive material layer and an end of the wiring layer intersect, is defined as X, a point where a straight line extending along the second direction from the point X intersects a straight line extending along the first direction through the center of the radius R of curvature of the conductive material layer, is defined as Y, and the distance between the points X and Y as viewed in the second direction is defined as A, the relations in $\cos^{-1}(A/R)>46$ are established.

4 Claims, 4 Drawing Sheets

US 6,452,245 B1

SEMICONDUCTOR DEVICE

BACKGROUND OF THE INVENTION

1. Field of the Invention

The present invention relates to a semiconductor device and a method of manufacturing the same, and particularly to formation of a wire in the neighborhood of a contact.

2. Description of the Related Art

As a technique for forming a high-withstand contact, which is suitable for use in a semiconductor device, there is known one wherein a P-type high-concentration impurity diffused region is formed in an N-type semiconductor substrate, an aperture or opening is defined in an oxide film on the substrate at a portion corresponding to the P-type high-concentration impurity diffused region, and a wiring layer is formed over the opening and the oxide film, thereby forming a drawing or lead wire.

In such a structure, a depletion layer is formed over the surface of the semiconductor substrate located below the wire. An N-type high-concentration impurity diffused region might be formed at a portion spaced by a predetermined distance from the P-type high-concentration impurity diffused region so as to avoid an excessive expansion of the depletion layer. There might be cases where even in this structure, a desired element characteristic was not obtained due to a problem such as concentration of an electric field with an increase in voltage to be handled.

Thus, in the preceding application (Japanese Patent Application No. Hei 10-17848) made by the inventors of the present application, each of conductive material layers being placed under the same potential as a substrate potential was formed over an oxide film placed over a semiconductor substrate, an interlayer dielectric was formed over the conductive material layers, and a wiring layer drawn from an opening was formed over the interlayer dielectric, thereby controlling a region for forming a depletion layer.

However, it has been confirmed by the inventors that in the conventional structure of the drawing or lead wire placed in the vicinity of the contact, a sufficient withstand voltage cannot be obtained depending on how to cross the wiring layer and the conductive material layers.

SUMMARY OF THE INVENTION

In order to solve the foregoing problems, there is provided a semiconductor device according to the present invention, comprising a second conduction type impurity diffused region formed over the surface of a first conduction type semiconductor substrate, a first conduction type impurity diffused region formed over the surface of the semiconductor substrate in a concentration higher than an impurity concentration of the semiconductor substrate with a predetermined interval left from the second conduction type impurity diffused region, a first insulating film formed over the semiconductor substrate, conductive material layers each formed over the semiconductor substrate placed between the second conduction type impurity diffused region and the first conduction type impurity diffused region or over the first insulating film above said first conduction type impurity diffused region, each conductive material layer having a predetermined radius of curvature in the direction of a plane as viewed from an upper surface of the substrate, a second insulating film formed over the conductive material layers and the first insulating film, an opening defined in the first and second insulating films above the second conduction type impurity diffused region, and a wiring layer formed over the opening and the second insulating film, and wherein the direction in which the wiring layer extends in the plane direction as viewed from the upper surface of the substrate, is defined as a first direction, the direction orthogonal to the first direction on the plane is defined as a second direction, a radius of curvature of the conductive material layer closest to the opening is defined as R, a point where the conductive material layer and an end of the wiring layer intersect on the plane, is defined as X, a point where a straight line extending along the second direction from the point X intersects a straight line extending along the first direction through the center of the radius R of curvature of the conductive material layer, is defined as Y, and the distance between the points X and Y with respect to the second direction is defined as A, whereby the relations in $COS^{-1}(A/R)>46$ are established.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

PREFERRED EMBODIMENTS OF THE INVENTION

Preferred embodiments of the present invention will hereinafter be described in detail with reference to the accompanying drawings.

FIRST EMBODIMENT

Figure 1:
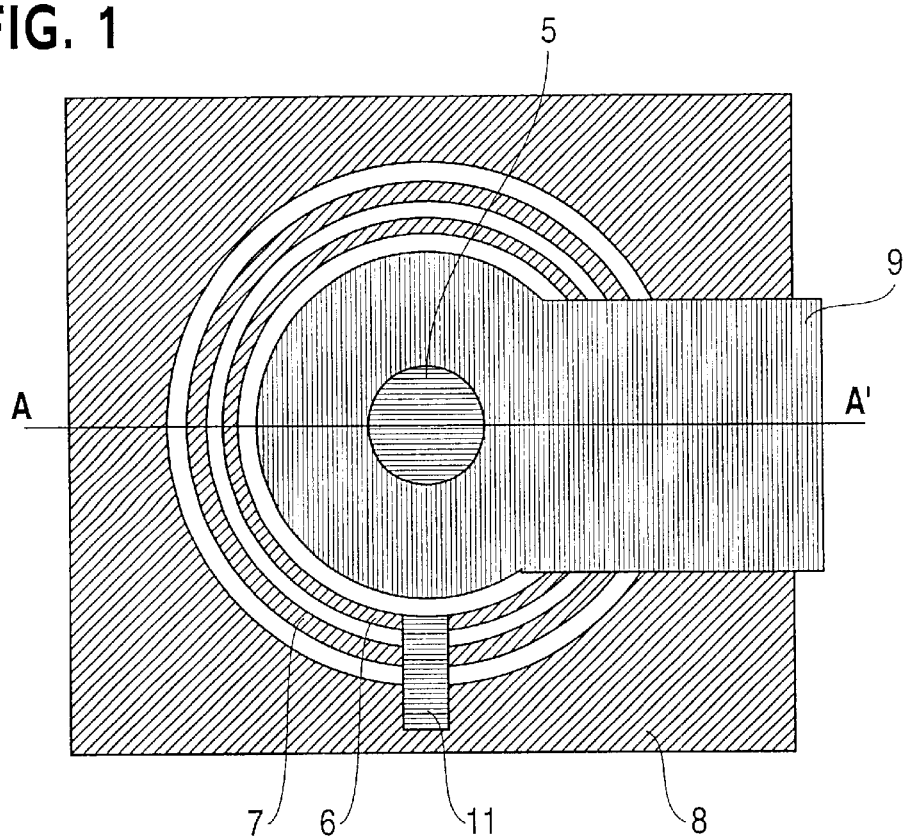
FIG. 1 is a top view showing a semiconductor device according to a first embodiment of the present invention.
Figure 2:
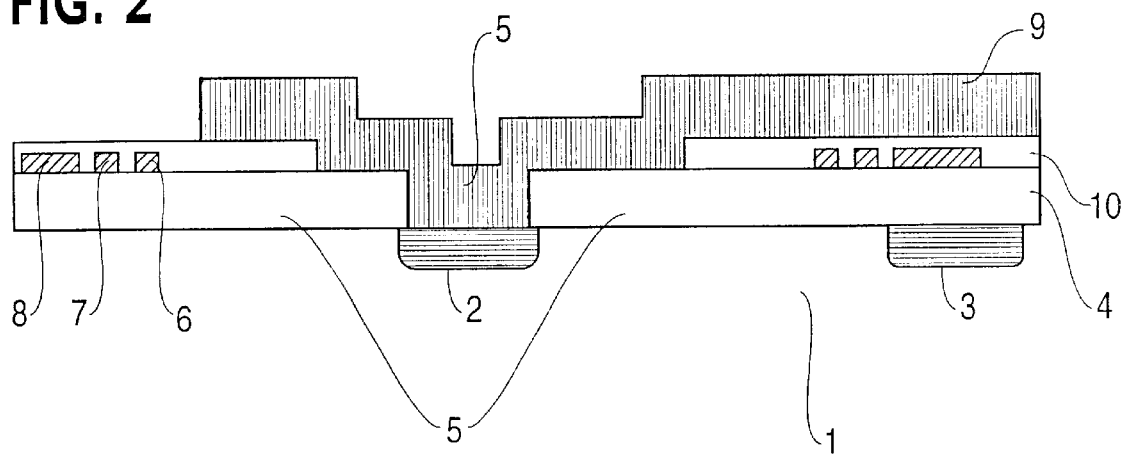
FIG. 2 is a cross-sectional view illustrating the semiconductor device in which the present invention is embodied.

FIG. 1 is a view showing a drawing or lead wire or interconnection placed in the neighborhood of a contact part or unit employed in a first embodiment of the present invention as viewed from the top thereof. FIG. 2 is a view illustrating a cross section taken along line A—A' in FIG. 1. A structure of the contact unit employed in the present invention will be described below with reference to FIGS. 1 and 2.

In the present embodiment, a description will be made of a case in which a diode is formed over a semiconductor substrate.

A P-type high-concentration impurity diffused layer 2, which serves as an anode, is formed over the surface of an N-type semiconductor substrate 1 having 20 Ω·cm by the known photolithography technology and impurity diffusion technology. An N-type high-concentration impurity diffused layer 3, which serves as a channel stopper, is formed at a portion spaced a predetermined distance (about 55 μm) from the P-type high-concentration impurity diffused layer 2.

An oxide film 4 having a thickness of about 1.0 μm is formed over the semiconductor substrate 1 by thermal oxidation. An aperture or opening 5 is defined in a portion of the oxide film 4, which corresponds to an upper portion of the P-type high-concentration impurity diffused layer 2. The size of the opening 5 is about 40 μm in diameter. Conductive material layers 6, 7 and 8 such as polysilicon are concentrically formed over the oxide film 4 around the opening 5 so as to surround the opening 5. Each of the conductive material layers such as polysilicon is about 1000 Å in thickness. The first conductive material layer 6 nearest to the opening is formed at a portion about 40 μm distant from the opening in 1-μm width.

The second conductive material layer 7 is formed in 1-μm width with a spacing of about 4 μm defined between the first conductive material layer 6 and the second conductive material layer 7. Further, the third conductive material layer 8 is formed in a width of several tens of μm with a further spacing of 4 μm. The third conductive material layer 8 is connected to the N-type high-concentration impurity diffused layer 3 through a contact hole 11 defined in a predetermined portion of the oxide film 4. Further, the third conductive material layer 8 is formed so as to take the same potential as the N-type semiconductor substrate 1 and the N-type high-concentration impurity diffused layer 3. The first conductive material layer 6 and the second conductive material layer 7 are connected to the third conductive material layer 8 at a predetermined portion through the use of another wiring layer, a contact or the like. The first and second conductive material layers 6 and 7 are also identical in potential to the N-type semiconductor substrate. The predetermined portion described herein indicates a portion other than a portion from which a wire or interconnection 9 to be described later is drawn, i.e., a portion where the wire 9 and the conductive material layers overlap as seen from the top view shown in FIG. 1.

These conductive material layers 6, 7 and 8 prevent a depletion layer 12 formed between a P-type high-concentration impurity region and the N-type semiconductor substrate from being spread along the substrate surface below the wire 9 to be described later and extending to the N-type high-concentration impurity region 3 used as the channel stopper.

An interlayer dielectric 10 is formed over the oxide film 4 excluding the neighborhood of the opening 5, and the conductive material layers 6, 7 and 8 by a CVD technique or the like. The interlayer dielectric 10 is formed so as to expose the surface of the oxide film 4 to some extent. In the present embodiment, the width of the exposed surface of the oxide film 4 is formed so as to reach about 20 μm.

The wiring layer 9 having a predetermined width is formed over the opening 5, the exposed oxide film 4 and the interlayer dielectric 10. Further, the wiring layer is formed above the concentrically-formed conductive material layers. Since a large current normally flows in a high-withstand element, a thick wire or interconnection having about several tens of μm is used.

Since, at this time, the interlayer dielectric 10 is formed so as to expose the surface of the oxide film 4 to some extent, the wiring layer 9 is formed even over the surface of the oxide film 4, which is located in the vicinity of the opening 4. The wiring layer at such a portion serves as a so-called field plate and is capable of preventing a reduction in withstand voltage by narrowing of the depletion layer over the substrate surface and concentration of an electric field due to its narrowing.

According to detailed experiments made by the inventors of the present application, it has been confirmed in the first embodiment having such a configuration that when each conductive material layer referred to above has a predetermined radius of curvature, a withstand-voltage characteristic of the contact unit would change based on the placement of each conductive material layer having the predetermined radius of curvature and the wiring layer.

The inventors of the present application have confirmed that one principally concerned with the withstand-voltage characteristic is an angle of a point where the conductive material layer and the end of the wiring layer intersect, and the withstand voltage is lowered as the angle becomes small.

As is understood by seeing FIG. 1, the angle of the intersecting portion is minimized at a portion where the first conductive material layer nearest to the opening 5 and the wiring layer intersect.

Figure 3:
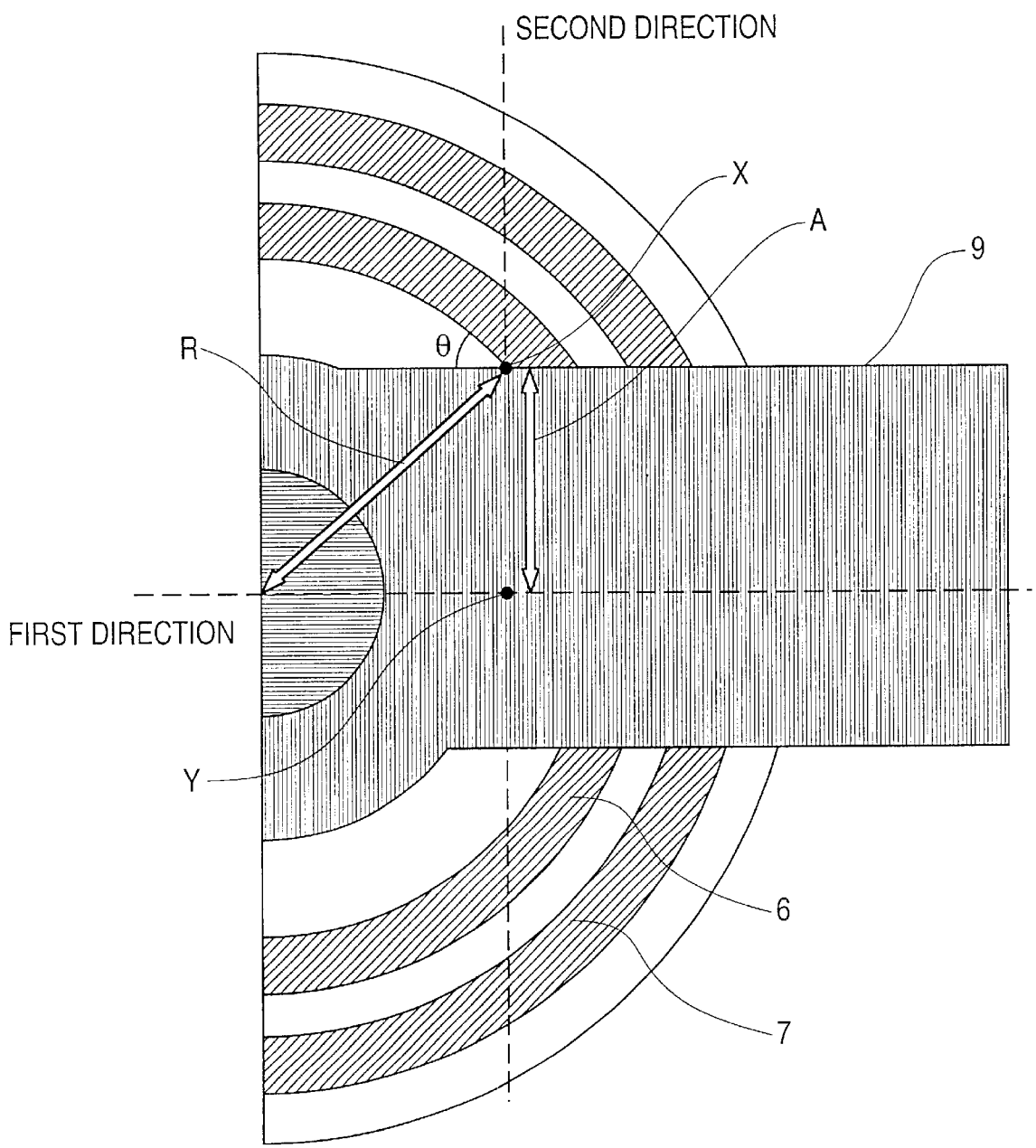
FIG. 3 is a top plan enlarged view depicting the first embodiment of the present invention.

FIG. 3 is a view showing part of FIG. 1 in an enlarged form. The part thereof will be described in more details using FIG. 3. A leading or drawing direction in which the wiring layer extends, is defined as a first direction and the direction of the width of the wiring layer, which extends orthogonally to the first direction, is defined as a second direction. The radius of curvature of the innermost first conductive material layer 6, which is closest to the opening, is defined as R. A point where the first conductive material layer 6 and an end of the wiring layer 9 intersect, is defined as X. A point where a straight line extending along the second direction from the point X and a straight line extending along the first direction through the center of a circle having a radius R intersect, is defined as Y. At this time, the distance between the points X and Y with respect to the second direction results in a width A of a portion for determining the angle of a portion where the corresponding conductive material layer and the wiring layer intersect.

The angle θ of the portion where the conductive material layer and the wiring layer intersect, changes according to the radius of curvature R of the conductive material layer and the distance A between the points X and Y.

Figure 4:
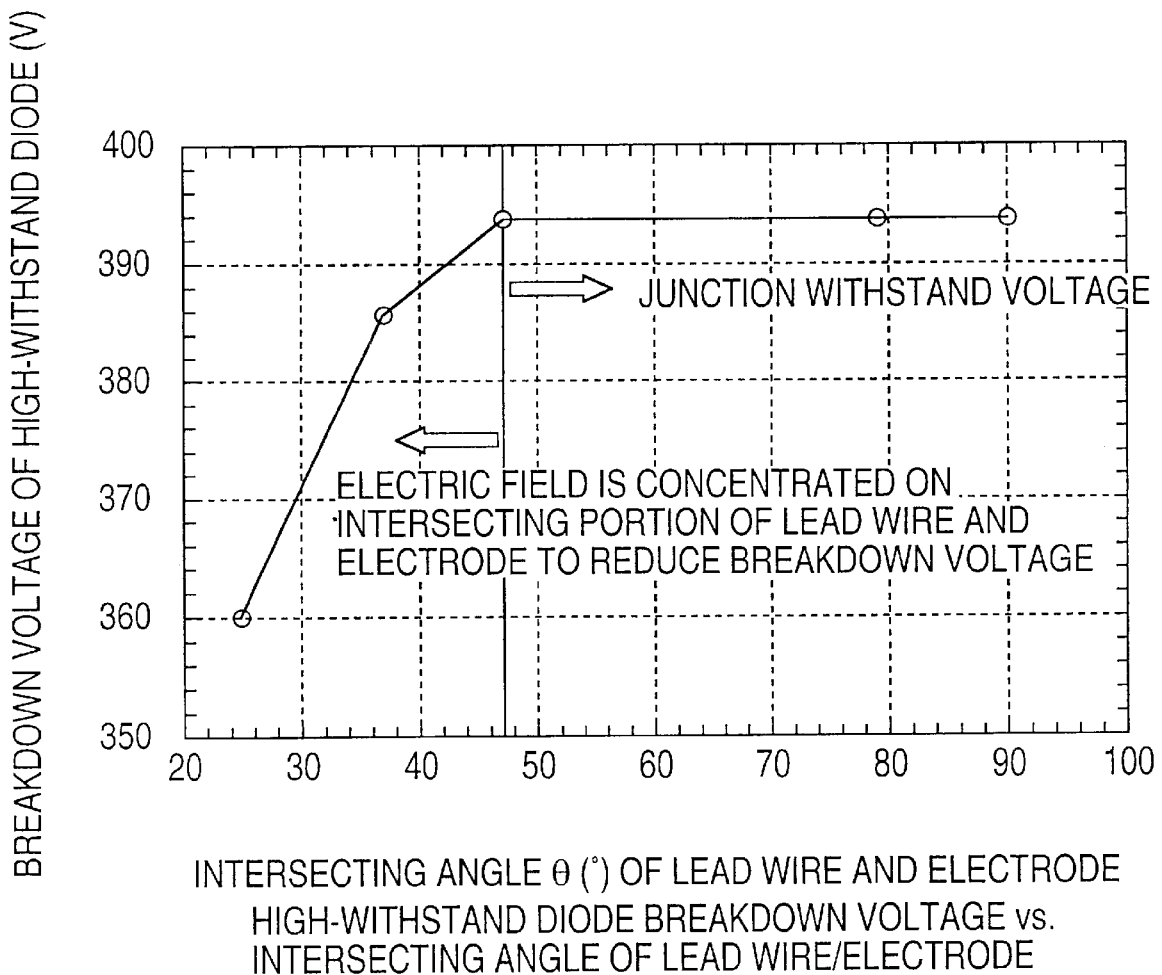
FIG. 4 is a view showing the relationship between a withstand voltage and an angle employed in the present invention.

FIG. 4 is a diagram showing an angle θ vs. diode breakdown voltage at the time that the radius of curvature R and the distance A between the points X and Y are varied.

According to experiments made by the inventors of the present application, it has been confirmed that if the angle θ of the portion where the conductive material layer and the wiring layer intersect, is smaller than 46°, a stable withstand voltage is not obtained as shown in FIG. 4.

Thus, the above-described condition is normally obtained in the following manner if expressed using the radius of curvature R and the distance A between the points X and Y.

$$\theta = \cos^{-1}(A/R) > 46$$

Namely, the width of the wire and the radius of curvature are determined so as to satisfy the above-described expression, thereby making it possible to improve the withstand voltage and promote the stability of the high-withstand element.

According to the present embodiment as described above in detail, since conductive material layers are formed below a wiring layer drawn from an aperture or opening so as to surround the opening, a depletion layer formed over a substrate surface along a wire can be prevented from extending to an N-type high-concentration impurity diffused region 3.

Since the wire 9 is formed over the surface of an oxide film 4 located in the neighborhood of the opening, this portion fulfills the role of a field plate. Namely, it is possible to prevent the occurrence of a reduction in withstand voltage due to the narrowing of the depletion layer over the substrate surface.

A high-withstand element can be provided wherein when a wire crossing over each conductive material layer having a predetermined radius of curvature is formed, a condition for the wire with respect to the radius of curvature is determined to prevent a reduction in withstand voltage.

SECOND EMBODIMENT

Figure 5:
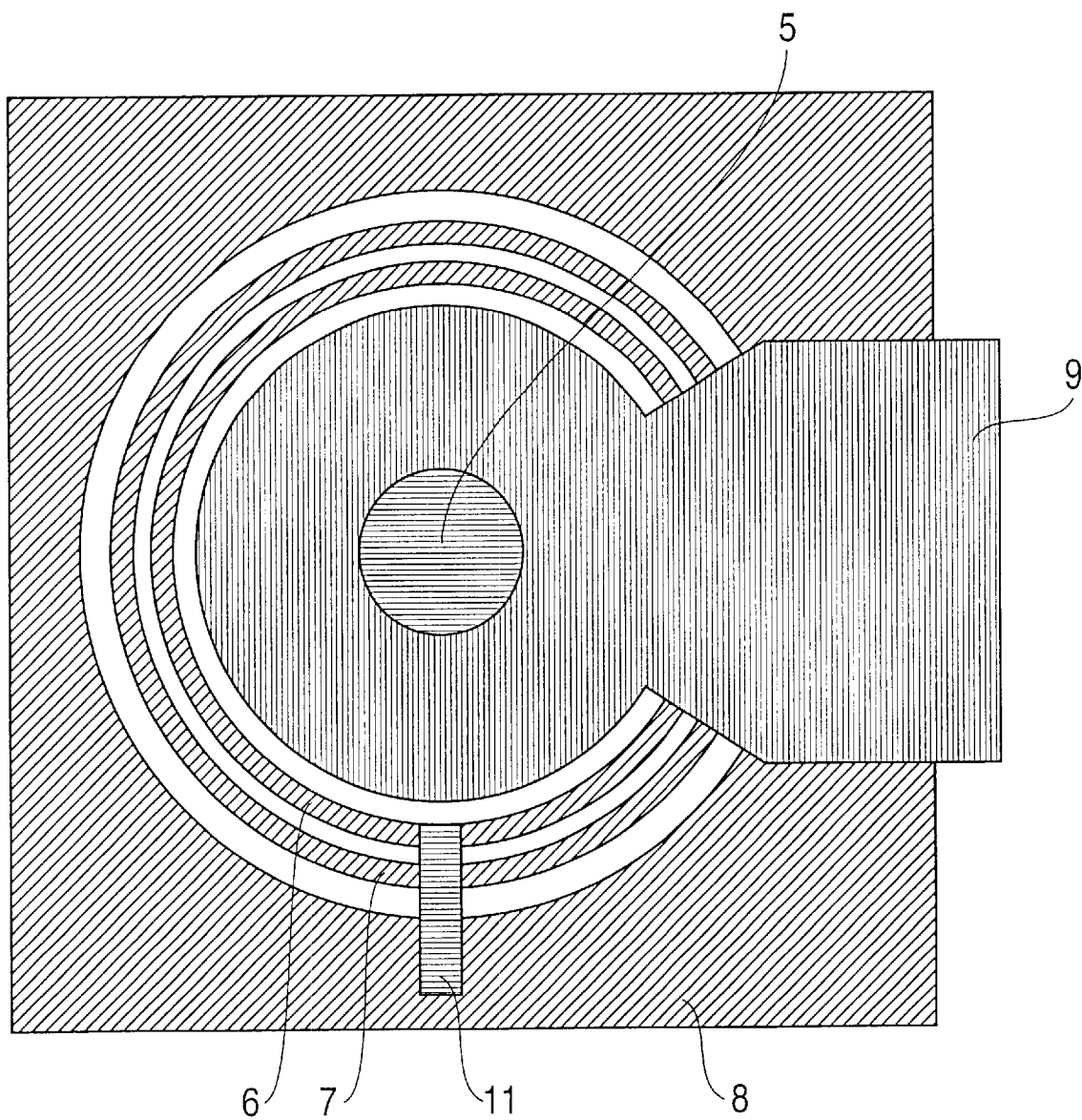
FIG. 5 is a top view illustrating a semiconductor device according to a second embodiment of the present invention.

FIG. 5 is a top view showing a second embodiment of the present invention. Incidentally, since the present embodiment is identical in sectional structure to the first embodiment, the description thereof will be omitted.

In the second embodiment, the form of a wiring layer 9 as viewed from its upper surface is different from that of the wiring layer employed in the first embodiment. In the second embodiment, the wiring layer 9 has a taper-shaped inclined portion wherein a portion thereof close to a contact of the wiring layer 9 becomes narrow and a portion thereof distant from the contact becomes wide.

The tapered portion is provided from a portion close to the opening 5 rather than a first conductive material layer 6. Further, an angle at which the corresponding conductive material layer and the wiring layer intersect, is set to such a value as to present no problem.

Owing to the provision of such a tapered shape, the angle at which the conductive material layer and the wiring layer intersect, can be further reduced as compared with the first embodiment, thus making it possible to form a semiconductor device more excellent in withstand characteristic.

While the present invention has been described with reference to the illustrative embodiments, this description is not intended to be construed in a limiting sense. Various modifications of the illustrative embodiments, as well as other embodiments of the A invention, will be apparent to those skilled in the art on reference to this description. It is therefore contemplated that the appended claims will cover any such modifications or embodiments as fall within the true scope of the invention.

What is claimed is:

1. A semiconductor device, comprising:

a second conduction type impurity diffused region formed at the surface of a first conduction type semiconductor substrate;

a first conduction type impurity diffused region formed at the surface of the semiconductor substrate in a concentration higher than an impurity concentration of the semiconductor substrate with a predetermined interval left from said second conduction type impurity diffused region;

a first insulating film formed over the semiconductor substrate, the first insulating film defining a first opening above said second conduction type impurity diffused region;

a conductive layer formed over the semiconductor substrate placed between said second conduction type impurity diffused region and said first conduction type impurity diffused region, said conductive layer having slits each of which having a predetermined radius of curvature in the direction of a plane as viewed from an upper surface of the substrate;

a second insulating film formed over said conductive layer and said first insulating film, the second insulating film defining a second opening above said second conduction type impurity diffused region; and a wiring layer formed over said first and second openings and said second insulating film;

wherein the direction in which said wiring layer extends in the plane direction as viewed from the upper surface of the substrate, is defined as a first direction, the direction orthogonal to the first direction on the plane is defined as a second direction, a radius of curvature of a side surface of said conductive layer nearest to said first and second openings is defined as R, a point wherein said conductive layer and an end of said wiring layer intersect on the plane, is defined as X, a point where a straight line extending along the second direction from the point X intersects a straight line extending along the first direction through the center of the radius R of curvature of said conductive material layer, is defined as Y, and the distance between the points X and Y with respect to the second direction is defined as A, whereby the relations in $\cos^{-1}(A/R) > 46$ are established.

2. A semiconductor device, comprising:

a second conduction type impurity diffused region formed at the surface of a first conduction type semiconductor substrate;

a first conduction type impurity diffused region formed at the surface of the semiconductor substrate in a concentration higher than an impurity concentration of the semiconductor substrate with a predetermined interval left from said second conduction type impurity diffused region;

a first insulating film formed at the semiconductor substrate, the first insulating film defining a first opening above said second conduction type impurity diffused region;

a conductive layer formed over the semiconductor substrate placed between said second conduction type impurity diffused region and said first conduction type impurity diffused region or over said first insulating film above said first conduction type impurity diffused region, said conductive layer having slits each of which having a predetermined radius of curvature in the direction of a plane as viewed from an upper surface of the substrate;

a second insulating film formed over said conductive layer and said first insulating film, the second insulating film defining a second opening above said second conduction type impurity diffused region; and a wiring layer formed over said first and second openings and said second insulating film;

wherein the direction in which said wiring layer extends in the plane direction as viewed from the upper surface of the substrate, is defined as a first direction, the direction orthogonal to the first direction on the plane is defined as a second direction, and said wiring layer has a first width with respect to the second direction at a portion spaced by a first distance from said first and second openings, and a second width with respect to the second direction at a portion spaced by a second distance longer than the first distance, said second width being greater than the first width.

3. The semiconductor device according to claim 1, said conductive layer being divided into a plurality of sub-conductive layers by said slits, each of sub conductive layers being electrically connected to other sub conductive layers.

4. The semiconductor device according to claim 2, said conductive layer being divided into a plurality of sub-conductive layers by said slits, each of sub conductive layers being electrically connected to other sub conductive layers.

* * * * *